(12) United States Patent
Cheng et al.

(10) Patent No.: US 12,557,238 B2
(45) Date of Patent: Feb. 17, 2026

(54) NETWORK SWITCH WITH REMOVABLE MANAGEMENT UNIT

(71) Applicant: Beijing Zitiao Network Technology Co., Ltd., Beijing (CN)

(72) Inventors: Chuansheng Cheng, Beijing (CN); Yongcan Wang, Beijing (CN); Dayong Shen, Beijing (CN); Shenglin Lin, Beijing (CN); Zhandong Sun, Beijing (CN); Jian Wang, Beijing (CN)

(73) Assignee: Beijing Zitiao Network Technology Co., Ltd., Beijing (CN)

( * ) Notice: Subject to any disclaimer, the term of this patent is extended or adjusted under 35 U.S.C. 154(b) by 0 days.

(21) Appl. No.: 18/985,515

(22) Filed: Dec. 18, 2024

(65) Prior Publication Data

US 2025/0212356 A1    Jun. 26, 2025

(30) Foreign Application Priority Data

Dec. 25, 2023    (CN) .......................... 202311797543.6

(51) Int. Cl.
*H05K 7/14*    (2006.01)

(52) U.S. Cl.
CPC .................................. *H05K 7/1492* (2013.01)

(58) Field of Classification Search
CPC ............................. H05K 7/1492; H05K 7/186
See application file for complete search history.

(56) References Cited

U.S. PATENT DOCUMENTS

| | | | | |
|---|---|---|---|---|
| 10,568,238 | B1 * | 2/2020 | Leung | H05K 7/20736 |
| 11,906,800 | B2 * | 2/2024 | Hemp | G02B 6/4284 |
| 2023/0164944 | A1 | 5/2023 | Levy | |

FOREIGN PATENT DOCUMENTS

| | | |
|---|---|---|
| CN | 103138940 A | 6/2013 |
| CN | 204633800 U | 9/2015 |
| CN | 112394782 A | 2/2021 |
| CN | 214412941 U | 10/2021 |
| CN | 117061463 A | 11/2023 |
| CN | 117768423 A | 3/2024 |

OTHER PUBLICATIONS

ISA China National Intellectual Property Administration, International Search Report Issued in Application No. PCT/CN2024/134698, Feb. 24, 2025, WIPO, 5 pages.
Extended European Search Report for European Application No. 24220314.9, mailed May 22, 2025, 9 pages.

* cited by examiner

*Primary Examiner* — James Wu
(74) *Attorney, Agent, or Firm* — Alleman Hall LLP

(57) ABSTRACT

A network switch includes: a housing including a first end plate and a second end plate spaced; a fan module and a power supply module respectively disposed in the housing adjacent to the second end plate; a switching unit at least partially disposed in the housing adjacent to the first end plate, the switching unit including a first connector disposed in the housing; and a management unit disposed in the housing and movable relative to the second end plate, an end of the management unit adjacent to the second end plate being provided with a second connector capable of mating with the first connector, the second connector being disconnected from the first connector when the management unit is drawn out of the housing through the first end plate, and being connected to the first connector when the management unit is inserted into the housing through the first end plate.

10 Claims, 7 Drawing Sheets

NETWORK SWITCH WITH REMOVABLE MANAGEMENT UNIT

CROSS-REFERENCE

The present application claims priority to Chinese Patent Application No. 202311797543.6, filed on Dec. 25, 2023, and entitled "NETWORK SWITCH", the entirety of which is incorporated herein by reference.

FIELD

Embodiments of the present disclosure generally relate to the technical field of network devices, and more particularly, to a network switch.

BACKGROUND

In a conventional network switch hardware device of a data center, the entire switch generally comprises a switching unit, a management unit, a fan module and a power supply module formed in a chassis. The switching unit is responsible for data exchange and generally comprises a high-speed input/output (HSIO) port and a switching chip. The management unit is responsible for device management and generally comprises management chips such as a central processing unit (CPU), a memory, a solid state drive (SSD), and a programmable logic device (CPLD). The fan module is used for heat dissipation of the entire device. The power supply module is used for power supply of the device.

For a network switch hardware device of a data center, more than 80% of the hardware failure rate of the device occurs in the management unit, for example, devices such as an SSD, a memory, and a CPU in the management unit. In the case where the above components fail and need to be repaired and replaced, the entire chassis needs to be removed from a rack, and the cover of the chassis needs to be opened to try to replace the faulty components. Therefore, the damage of one component of the management unit requires the replacement of the entire chassis. The maintenance of the chassis on and off the rack is cumbersome and the workload is large, resulting in a high maintenance cost.

SUMMARY

Embodiments of the present disclosure provide a network switch. The network switch comprises: a housing comprising a first end plate and a second end plate spaced apart from each other; a fan module and a power supply module respectively disposed in the housing adjacent to the second end plate; a switching unit at least partially disposed in the housing adjacent to the first end plate, the switching unit comprising a first connector disposed in the housing; and a management unit disposed in the housing and movable relative to the second end plate, the switching unit being located outside a path of the management unit moving away in a direction from the second end plate, an end of the management unit adjacent to the second end plate being provided with a second connector capable of mating with the first connector, wherein the second connector is disconnected from the first connector when the management unit is drawn out of the housing through the first end plate in a direction away from the second end plate; and the second connector is connected to the first connector when the management unit is inserted into the housing through the first end plate in a direction toward the second end plate.

According to the embodiments of the present disclosure, the management unit and the switching unit are connected by the first connector and the second connector. When the management unit fails, the management unit is drawn out of the housing through the first end plate in a direction away from the second end plate, so that the management unit can be replaced without replacing the entire device, thereby solving the problems of a cumbersome maintenance process and a high maintenance cost of the conventional network switch.

In addition, since the management unit is drawn out of the housing through the first end plate and the fan module and the power supply module are adjacent to the second end plate, the fan module and the power supply module do not need to be plugged and unplugged when the management unit is drawn out of the housing, and the operation steps can also be saved.

It should be understood that the content described in this part is not intended to limit the key features or important features of the embodiments of the present disclosure, nor is it used to limit the scope of the present disclosure. Other features of the present disclosure will become readily understandable through the following description.

BRIEF DESCRIPTION OF THE DRAWINGS

The above and other features, advantages and aspects of the various embodiments of the present disclosure will become more apparent with reference to the following detailed description in conjunction with the accompanying drawings. In the drawings, the same or similar reference numerals denote the same or similar elements, wherein.

Figure 1:
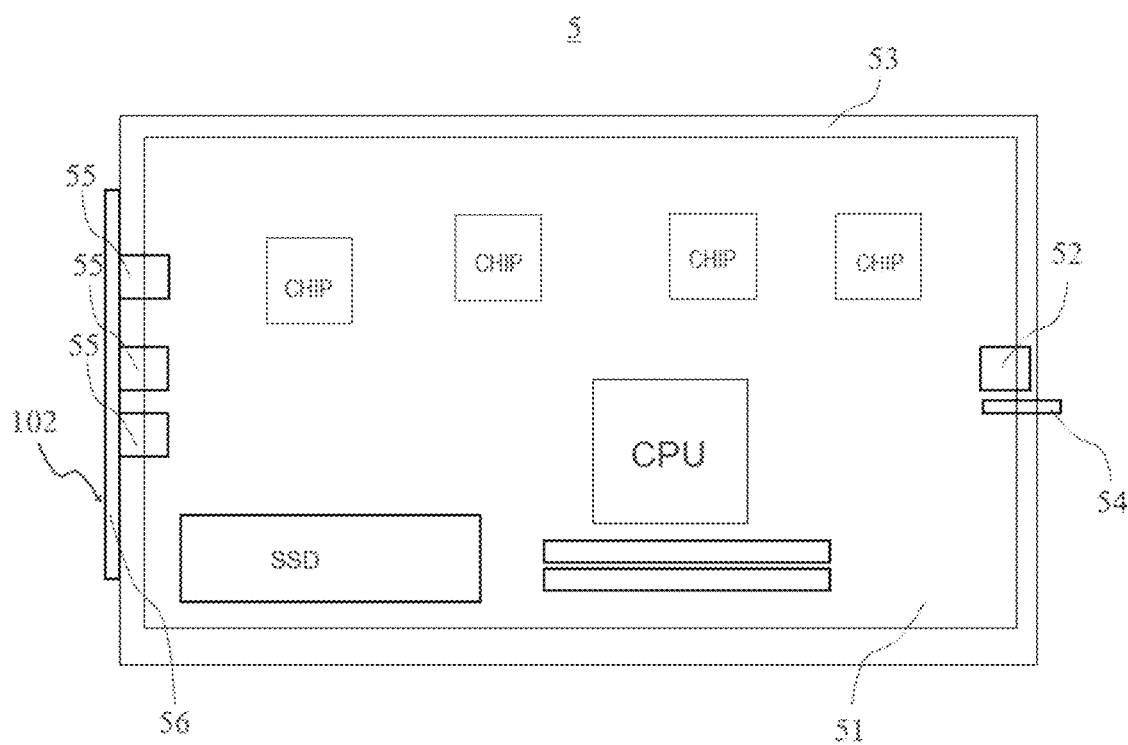
FIG. 1 shows a schematic structural diagram of a management unit along a top-down view according to some embodiments of the present disclosure.

REFERENCE NUMERALS 100 is a network switch, 101 is a pressed position, and 102 is a popped position;
1 is a housing, 11 is a first end plate, 111 is a moving slot, 1111 is a first moving slot, 1112 is a second moving slot, 12 is a second end plate, 13 is a top plate, 14 is a bottom plate, 15 is a first side plate, 16 is a second side plate;
2 is a fan module, 21 is a fan unit plate, 22 is a fan device, and 23 is a fan connector;
3 is a power supply module, 31 is a power supply unit plate, 32 is a power supply device, and 33 is a power supply connector;
4 is a switching unit, 41 is a switching unit plate, 411 is a first adapter, 42 is a first connector, 43 is an adapter plate, 431 is a second adapter, and 44 is an input/output port, and 45 is a guide groove;
5 is a management unit, 51 is a management unit plate, 511 is a first management unit plate, 512 is a second management unit plate, 52 is a second connector, 53 is a moving bracket, 54 is a guide member, 55 is a management interface, and 56 is a handle.

DETAILED DESCRIPTION

Preferred embodiments of the present disclosure will be described in more detail below with reference to the accompanying drawings. Although preferred embodiments of the present disclosure are shown in the drawings, it should be understood that the present disclosure may be implemented in various forms and should not be limited by the embodiments set forth herein. Rather, these embodiments are provided to make the present disclosure more thorough and complete, and to fully convey the scope of the present disclosure to those skilled in the art.

The term "comprise" used herein and the variations thereof mean an open inclusion, that is, "comprise but not limited to". Unless specifically stated otherwise, the term "or" means "and/or". The term "based on" means "at least partially based on". The term "an example embodiment" and "an embodiment" mean "at least one example embodiment". The term "another embodiment" means "at least one another embodiment". The terms "first" and "second" and the like may refer to different or the same objects.

As described above, when a device in the management unit of the conventional network switch fails, the entire chassis needs to be removed from the rack, and the cover of the chassis needs to be opened to try to replace the faulty components. Therefore, the damage of one component of the management unit requires the replacement of the entire chassis, the maintenance of the chassis on and off the rack is cumbersome and the workload is large, resulting in a cumbersome maintenance process and a high maintenance cost. In addition, frequently drawing out the components may also damage an optical module. In addition, since the device assembly is complex, the personnel in the equipment room cannot complete on-site replacement in the absence of tools and accessories. Therefore, it is necessary to send the entire device back to the factory for repair. Sending the entire device back to the factory is slow with high maintenance costs and may be damaged again during transportation, resulting in the problem of failure location. Embodiments of the present disclosure provide a network switch 100 to at least partially solve the above problems. Hereinafter, the principle of the present disclosure will be described in conjunction with FIGS. 1 to 12.

Figure 2:
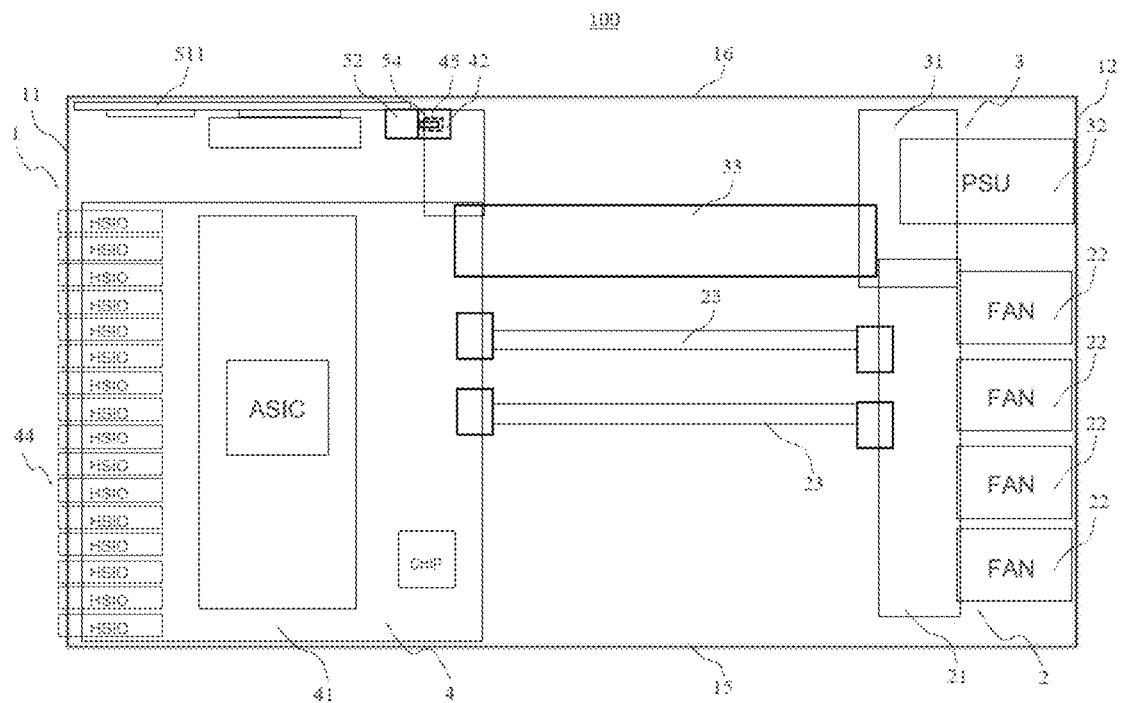
FIG. 2 shows a schematic structural diagram of a network switch along a top-down view according to some embodiments of the present disclosure, where the management unit is adjacent to the second side plate.
Figure 3:
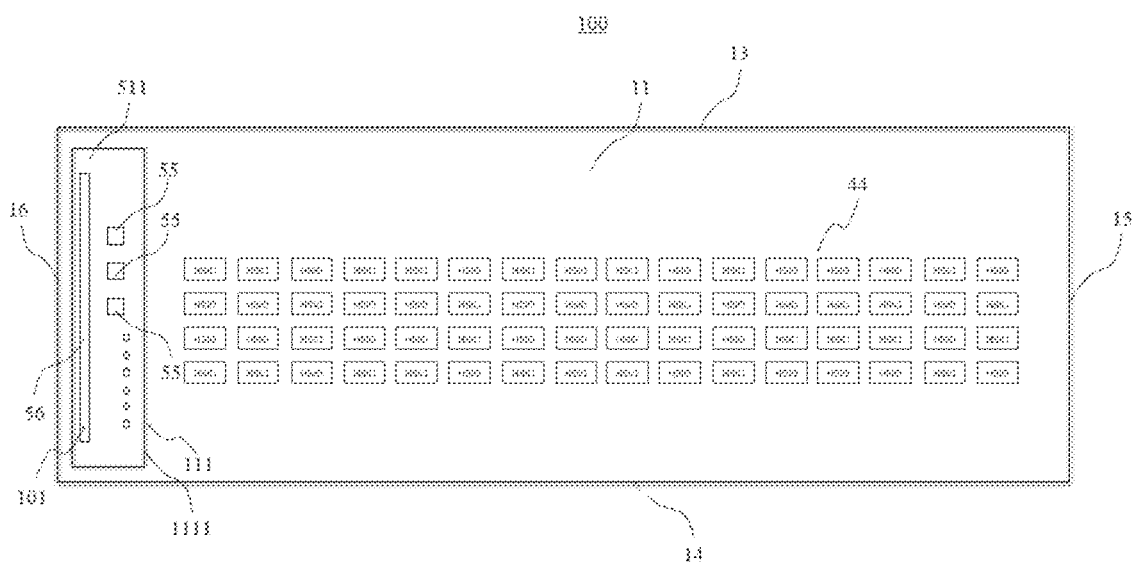
FIG. 3 shows a schematic structural diagram of the network switch shown in FIG. 2 along a side view.

FIG. 1 shows a schematic structural diagram of a management unit 5 along a top-down view according to some embodiments of the present disclosure. FIG. 2 shows a schematic structural diagram of a network switch 100 along a top-down view according to some embodiments of the present disclosure. The management unit 5 shown in FIG. 2 is adjacent to the second side plate 16. FIG. 3 shows a schematic structural diagram of the network switch 100 shown in FIG. 2 along a side view. As shown in FIGS. 1 to 3, the network switch 100 described herein generally comprises a housing 1, a fan module 2, a power supply module 3, a switching unit 4, and a management unit 5. The housing 1 is used as a mounting carrier, and the fan module 2, the power supply module 3, the switching unit 4, and the management unit 5 are arranged in the housing 1. The fan module 2 is used for heat dissipation of the entire device, and the power supply module 3 is used for power supply of the device of the network switch 100.

In some embodiments, the housing 1 may comprise a first end plate 11, a second end plate 12, a bottom plate 14, a first side plate 15, and a second side plate 16. The first end plate 11 and the second end plate 12 are arranged at two ends of the bottom plate 14, and the first end plate 11 and the second end plate 12 are spaced apart from each other. The first side plate 15 and the second side plate 16 are arranged at two sides of the bottom plate 14, and the first side plate 15 and the second side plate 16 are spaced apart from each other. The first end plate 11, the second end plate 12, the bottom plate 14, the first side plate 15 and the second side plate 16 together enclose to form the housing 1.

With continued reference to FIGS. 2 and 3, in some other embodiments, the housing 1 may further comprise a first end plate 11, a second end plate 12, a top plate 13, a bottom plate 14, a first side plate 15, and a second side plate 16. The first end plate 11 and the second end plate 12 are arranged at two ends of the bottom plate 14, and the first end plate 11 and the second end plate 12 are spaced apart from each other. The top plate 13 and the bottom plate 14 are spaced apart from each other. The first side plate 15 and the second side plate 16 are arranged at two sides of the bottom plate 14, and the first side plate 15 and the second side plate 16 are spaced apart from each other. The first end plate 11, the second end plate 12, the top plate 13, the bottom plate 14, the first side plate 15, and the second side plate 16 together enclose the housing 1.

With continued reference to FIG. 2, in some embodiments, the fan module 2 is adjacent to the second end plate 12, and the fan module 2 is arranged in the housing 1. The power supply module 3 is also adjacent to the second end plate 12, and the power supply module 3 is also arranged in the housing 1. The switching unit 4 is adjacent to the first end plate 11, and the switching unit 4 is at least partially arranged in the housing 1. The management unit 5 is arranged in the housing 1, and the management unit 5 is movable relative to the second end plate 12 to be drawn out or inserted from the first end plate 11. It can be seen that the fan module 2 and the power supply module 3 are respectively adjacent to the second end plate 12, while the switching unit 4 and the management unit 5 are adjacent to the first end plate 11. Therefore, when the management unit 5 is drawn out from the first end plate 11, the fan module 2 and the power supply module 3 do not need to be drawn out.

With continued reference to FIG. 2, further, the switching unit 4 comprises a first connector 42, and the first connector 42 is arranged in the housing 1. The management unit 5 comprises a second connector 52 mating with the first connector 42, and the second connector 52 is located at an end of the management unit 5 adjacent to the second end plate 12. With continued reference to FIG. 3, therefore, when the management unit 5 is drawn out of the housing 1 through the first end plate 11 in a direction away from the second end plate 12, the second connector 52 is disconnected from the first connector 42. When the management unit 5 is inserted into the housing 1 through the first end plate 11 in a direction toward the second end plate 12, the second connector 52 is connected to the first connector 42.

It should be noted that the switching unit 4 may be located outside a path of the management unit 5 moving in a direction away from the second end plate 12, thereby preventing the switching unit 4 from interfering with the management unit 5 being drawn out.

With the above configuration, the management unit 5 and the switching unit 4 are connected by the first connector 42 and the second connector 52. When the management unit 5 fails, the management unit 5 is drawn out of the housing 1 through the first end plate 11 in a direction away from the second end plate 12, so that the management unit 5 can be replaced without replacing the entire device, thereby solving the problems of a cumbersome maintenance process and a high maintenance cost of the conventional network switch. In addition, with the above configuration, it is not necessary to perform the operations of racking and de-racking the device, opening the cover of the chassis to try to replace the faulty components and drawing out the components for many times, and it is also possible to avoid damage to the optical module caused by frequently drawing out the components. In addition, with the above configuration, there is no need to return the entire device to the factory for repair, which avoids the problems of slow repair of the entire device, high maintenance costs and possible secondary damage during transportation which results in the failure location. Finally, since the management unit 5 is drawn out of the housing 1 through the first end plate 11 and the fan module 2 and the power supply module 3 are adjacent to the second end plate 12, when the management unit 5 is drawn out of the housing 1, the fan module 2 and the power supply module 3 do not need to be plugged and unplugged, and the operation steps can also be saved.

With continued reference to FIG. 2, in some embodiments, the switching unit 4 is fixedly arranged in the housing 1. The switching unit 4 is mainly responsible for data exchange, and may comprise a switching unit plate 41 and an input/output port 44. The switching unit plate 41 is fixedly arranged in the housing 1. The input/output port 44 is connected to the switching unit plate 41, and the input/output port 44 may extend out of the housing 1, that is, a part of the input/output port 44 is located in the housing 1. The switching unit plate 41 may be provided with a data exchange chip, and the data exchange chip may comprise at least one of an application-specific integrated circuit (ASIC) and a general-purpose chip.

With continued reference to FIG. 2, specifically, the management unit 5 is arranged in the housing 1, and the management unit 5 is mainly responsible for device management. An end of the management unit 5 away from the second end plate 12 is provided with a handle 56. The handle 56 is switchable between a pressed position 101 and a popped position 102, wherein the handle 56 is retracted into the management unit 5 when the handle 56 is in the pressed position 101, that is, the handle 56 is locked. The handle 56 extends out of the management unit 5 and allows the management unit 5 to be drawn out relative to the second end plate 12 when the handle 56 is in the popped position 102.

With continued reference to FIGS. 1 and 3, in some embodiments, the management unit 5 may further comprise a management unit plate 51, a moving bracket 53 and a management interface 55. The moving bracket 53 may be used as a mounting carrier. The management unit plate 51 and the handle 56 may be arranged on the moving bracket 53, and the handle 56 is located at an end of the moving bracket 53 away from the second end plate 12. An end of the management unit plate 51 away from the second end plate 12 may be provided with the management interface 55. The management interface 55 may be connected to a mobile terminal device through a network cable to control the network switch 100 through the mobile terminal device. An end of the management unit plate 51 facing the second end plate 12 is provided with the second connector 52. At least one of a CPU, a memory, an SSD and a CPLD may be arranged on the management unit plate 51.

In some embodiments, a moving slot 111 may be provided on the first end plate 11. The management unit plate 51 may be arranged in the moving slot 111, and the management unit plate 51 is movable relative to the second end plate 12 along the moving slot 111. More specifically, the moving bracket 53 mates with the moving slot 111, and the moving bracket 53 is movable relative to the second end plate 12 along the moving slot 111, thereby driving the management unit plate 51 to move.

With reference to FIG. 2, in some embodiments, the power supply module 3 is used for power supply of the device of the network switch 100. The power supply module 3 comprises a power supply unit plate 31, a power supply device 32 and a power supply connector 33. The power supply device 32 is adjacent to the second end plate 12, and the power supply device 32 is arranged on the power supply unit plate 31. The power supply unit plate 31 and the switching unit plate 41 are connected by the power supply connector 33.

The power supply connector 33 according to the embodiments of the present disclosure may be various types of connectors known at present or available in the future, which is not limited in the embodiments of the present disclosure. For example, in some embodiments, the power supply connector 33 may be a copper bar.

With reference to FIG. 2, in some embodiments, the fan module 2 is used for heat dissipation of the entire device. The fan module 2 comprises a fan unit plate 21, a fan device 22 and a fan connector 23. The fan device 22 is adjacent to the second end plate 12, and the fan device 22 is arranged on the fan unit plate 21. The fan unit plate 21 and the switching unit plate 41 are connected by the fan connector 23.

The fan connector 23 according to the embodiments of the present disclosure may be various types of connectors known at present or available in the future, which is not limited in the embodiments of the present disclosure. For example, in some embodiments, the fan connector 23 may be a cable for power supply to the fan unit plate 21 and transmission of management signals.

Hereinafter, the structure of the network switch 100 according to the embodiments of the present disclosure is exemplarily described in terms of the arrangement form of the management unit 5 relative to the housing 1 and the number of management unit plates 51.

It should be noted that no matter whether the management unit plate 51 comprises the first management unit plate 511 or the second management unit plate 512, each management unit plate 51 may be provided with the management interface 55, the second connector 52 and the guide member 54. In addition, each management unit plate 51 is connected to the moving bracket 53, and each moving bracket 53 is provided with the handle 56.

In addition, when the management unit plate 51 is adjacent to or away from the first side plate 15, the first connector 42 may be arranged on the switching unit plate 41. When the management unit plate 51 is adjacent to or away from the bottom plate 14, the switching unit plate 41 is away from or adjacent to the bottom plate 14. The switching unit 4 may further comprise an adapter plate 43 connected to the switching unit plate 41, and the first connector 42 is arranged on the adapter plate 43.

With continued reference to FIGS. 2 and 3, in some embodiments, the moving slot 111 comprises a first moving slot 1111, and the management unit plate 51 comprises a first management unit plate 511. The first management unit plate 511 is arranged in the first moving slot 1111, and the first management unit plate 511 is movable along the first moving slot 1111. The first management unit plate 511 is adjacent to the second side plate 16, that is, the first management unit plate 511 is away from the first side plate 15. The first connector 42 is arranged on the switching unit plate 41. The management unit 5 may be staggered from the input/output port 44 to avoid interference of the input/output port 44 with the movement of the management unit 5.

Obviously, by pulling the first management unit plate 511 in a direction away from the second end plate 12, the first management unit plate 511 can be drawn out of the housing 1 through the first end plate 11, and the second connector 52 is disconnected from the first connector 42. By pushing the first management unit plate 511 in a direction toward the second end plate 12, the first management unit plate 511 can be inserted into the housing 1 through the first end plate 11, and the second connector 52 is connected to the first connector 42.

With reference to FIG. 2, in this embodiment, the second connector 52 may be located on a side of the first management unit plate 511 away from the second side plate 16. Certainly, the second connector 52 may also be located on a side of the first management unit plate 511 facing the second side plate 16.

With reference to FIG. 2 and FIG. 3, in this embodiment, the guide member 54 may be arranged at an end of the first management unit plate 511 adjacent to the second end plate 12, and the guide member 54 may also be adjacent to the second connector 52. Correspondingly, the switching unit plate 41 may be provided with a guide groove 45 mating with the guide member 54. When the guide member 54 mates with the guide groove 45, the second connector 52 is connected to the first connector 42. With the above configuration, it can be ensured that the second connector 52 of the management unit plate 51 can be accurately and smoothly connected to the first connector 42 of the switching unit plate 41. Obviously, the guide groove 45 may also be arranged on a certain component in the housing 1, which is not limited here.

Figure 4:
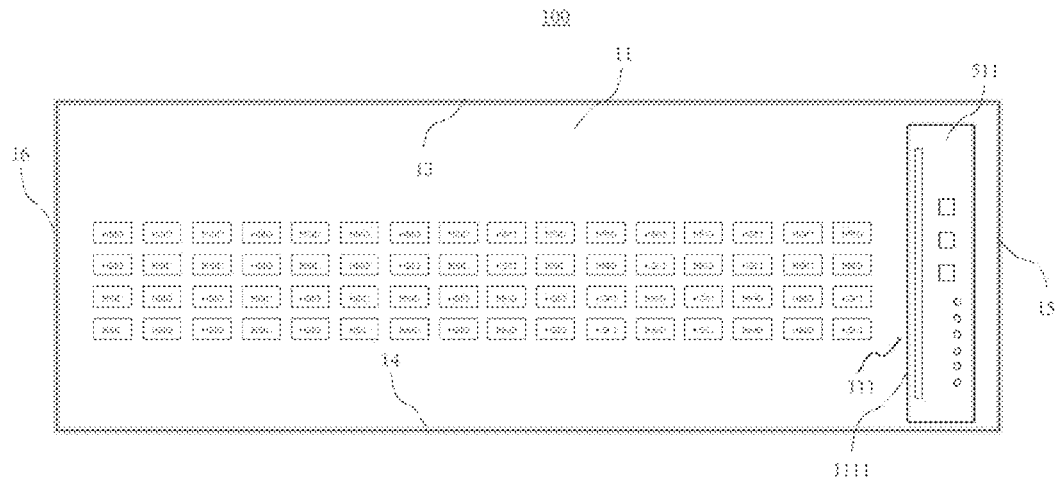
FIG. 4 shows a schematic structural diagram of a network switch along a side view according to some other embodiments of the present disclosure, where the management unit is adjacent to the first side plate.

FIG. 4 shows a schematic structural diagram of a network switch 100 along a side view according to some other embodiments of the present disclosure. The management unit 5 shown in FIG. 4 is adjacent to the first side plate 15. With continued reference to FIG. 4, the management unit plate 51 may comprise a first management unit plate 511, and the first management unit plate 511 may also be adjacent to the first side plate 15. The management unit 5 needs to be staggered from the input/output port 44 to avoid interference of the input/output port 44 with the movement of the management unit 5.

Figure 5:
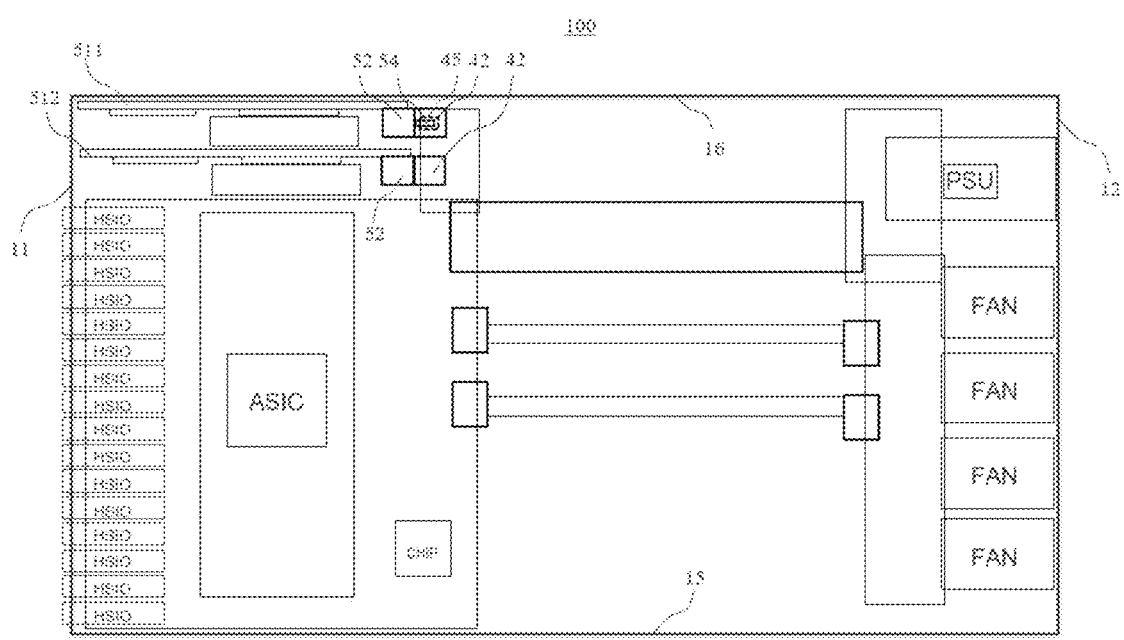
FIG. 5 shows a schematic structural diagram of a network switch along a top-down view according to some other embodiments of the present disclosure, where the management unit plate comprises the first management unit plate and the second management unit plate and is adjacent to the second side plate.
Figure 6:
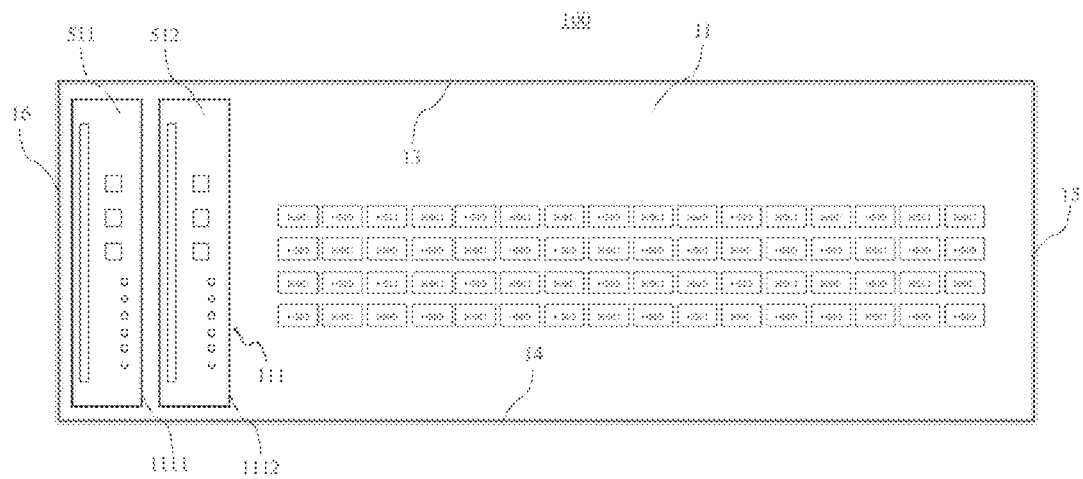
FIG. 6 shows a schematic structural diagram of the network switch shown in FIG. 5 along a side view.

FIG. 5 shows a schematic structural diagram of a network switch 100 along a top-down view according to some other embodiments of the present disclosure. The management unit plate 51 shown in FIG. 5 comprises a first management unit plate 511 and a second management unit plate 512, and the management unit plate 51 is adjacent to the second side plate 16. FIG. 6 shows a schematic structural diagram of the network switch 100 shown in FIG. 5 along a side view. As shown in FIGS. 5 and 6, in some other embodiments, the moving slot 111 comprises a first moving slot 1111 and a second moving slot 1112, and the first moving slot 1111 and the second moving slot 1112 are spaced apart from each other. The first management unit plate 511 is arranged in the first moving slot 1111, and the first management unit plate 511 is movable along the first moving slot 1111. The second management unit plate 512 is arranged in the second moving slot 1112, and the second management unit plate 512 is movable along the second moving slot 1112. The first management unit plate 511 and the second management unit plate 512 are respectively adjacent to the second side plate 16. The first connectors 42 are arranged in pairs on the switching unit plate 41, and the paired first connectors 42 are spaced apart from each other. The first management unit plate 511 and the second management unit plate 512 are respectively provided with the second connectors 52. The management unit 5 may be staggered from the input/output port 44 to avoid interference of the input/output port 44 with the movement of the management unit 5.

Obviously, by pulling the first management unit plate 511 and/or the second management unit plate 512 in a direction away from the second end plate 12, the first management unit plate 511 and/or the second management unit plate 512 can be drawn out of the housing 1 through the first end plate 11, and the second connector 52 may be disconnected from the first connector 42. By pushing the first management unit plate 511 and/or the second management unit plate 512 in a direction toward the second end plate 12, the first management unit plate 511 and/or the second management unit plate 512 are/is inserted into the housing 1 through the first end plate 11, and the second connector 52 may be connected to the first connector 42.

In this embodiment, the second connector 52 may be located on a side of the first management unit plate 511 away from the second side plate 16. Certainly, the second connector 52 may also be located on a side of the first management unit plate 511 facing the second side plate 16. In addition, the second connector 52 may be located on a side of the second management unit plate 512 away from the second side plate 16. Certainly, the second connector 52 may also be located on a side of the second management unit plate 512 facing the second side plate 16.

In this embodiment, the guide member 54 may be arranged at an end of the first management unit plate 511 adjacent to the second end plate 12, the guide member 54 may be arranged at an end of the second management unit plate 512 adjacent to the second end plate 12, and the guide member 54 may also be adjacent to the second connector 52. Correspondingly, with reference to FIG. 5, the switching unit plate 41 is provided with a guide groove 45 mating with the guide member 54. When the guide member 54 mates with the guide groove 45, the second connector 52 may be connected to the first connector 42. With the above configuration, it can be ensured that the second connector 52 of the management unit plate 51 can be accurately and smoothly connected to the first connector 42 of the switching unit plate 41. Obviously, the guide groove 45 may also be arranged on a certain component in the housing 1, which is not limited here.

In this embodiment, since the first management unit plate 511 and the second management unit plate 512 are simultaneously connected to the switching unit plate 41. For example, for some scenarios with high reliability requirements, when one of the first management unit plate 511 and the second management unit plate 512 fails, the network switch 100 can automatically switch to another management unit plate for access for working, so that the device does not power off, thereby avoiding the problem of device powering off caused by replacing the management unit plate 51.

It should be noted that the first management unit plate 511 and the second management unit plate 512 may also be respectively adjacent to the first side plate 15. Alternatively, one of the first management unit plate 511 and the second management unit plate 512 may be adjacent to the first side plate 15, and the other of the first management unit plate 511 and the second management unit plate 512 may be adjacent to the second side plate 16.

Figure 7:
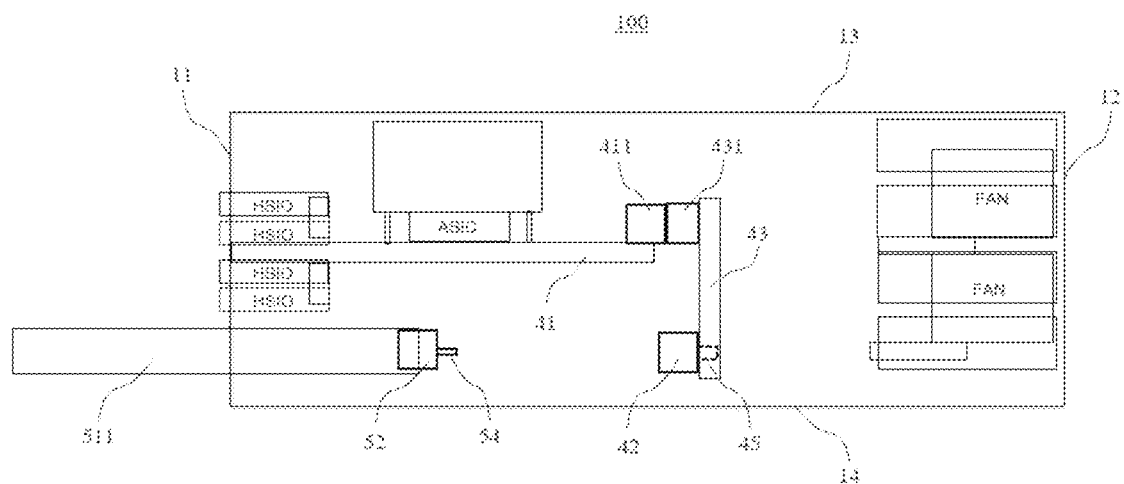
FIG. 7 shows a schematic structural diagram of a network switch along a front view according to some other embodiments of the present disclosure, where the management unit is adjacent to the bottom plate.
Figure 8:
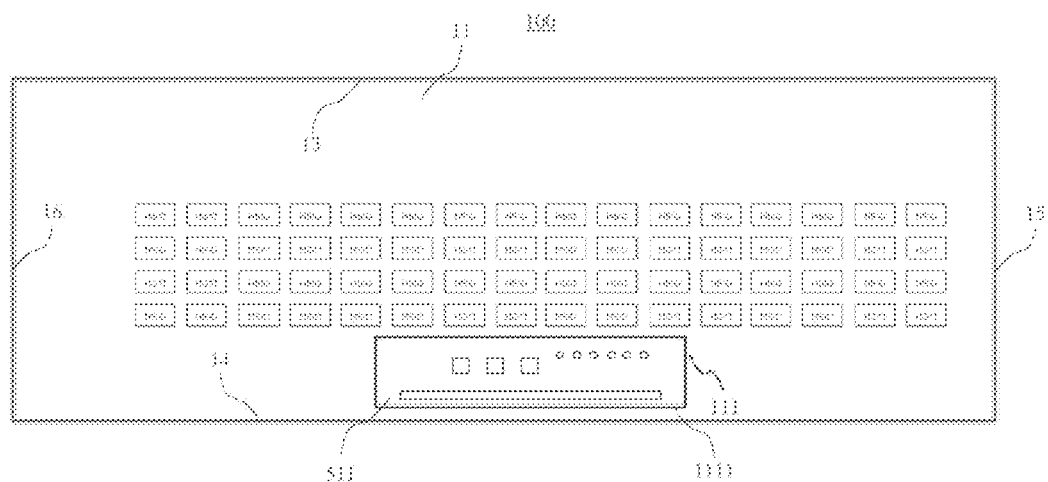
FIG. 8 shows a schematic structural diagram of the network switch shown in FIG. 7 along a side view.

FIG. 7 shows a schematic structural diagram of a network switch 100 along a front view according to some other embodiments of the present disclosure. The management unit 5 in FIG. 7 is adjacent to the bottom plate 14. FIG. 8 shows a schematic structural diagram of the network switch 100 shown in FIG. 7 along a side view. As shown in FIGS. 7 and 8, in some other embodiments, the moving slot 111 comprises a first moving slot 1111, and the management unit plate 51 comprises a first management unit plate 511. The first management unit plate 511 is arranged in the first moving slot 1111, and the first management unit plate 511 is movable along the first moving slot 1111. The first management unit plate 511 is adjacent to the bottom plate 14, then the switching unit plate 41 may be away from the bottom plate 14. The management unit 5 is staggered from the input/output port 44 to avoid interference of the input/output port 44 with the movement of the management unit 5. The switching unit 4 further comprises an adapter plate 43 connected to the switching unit plate 41, and the first connector 42 is arranged on the adapter plate 43, that is, the switching unit plate 41 and the management unit plate 51 are connected by the adapter plate 43.

Obviously, by pulling the first management unit plate 511 in a direction away from the second end plate 12, the first management unit plate 511 can be drawn out of the housing 1 through the first end plate 11, and the second connector 52 is disconnected from the first connector 42. By pushing the first management unit plate 511 in a direction toward the second end plate 12, the first management unit plate 511 can be inserted into the housing 1 through the first end plate 11, and the second connector 52 may be connected to the first connector 42.

In this embodiment, the second connector 52 may be located at an end of the first management unit plate 511 facing the second end plate 12. The guide member 54 may be arranged at an end of the first management unit plate 511 adjacent to the second end plate 12, and the guide member 54 may also be adjacent to the second connector 52. Correspondingly, with reference to FIG. 7, the adapter plate 43 is provided with a guide groove 45 mating with the guide member 54. When the guide member 54 mates with the guide groove 45, the second connector 52 may be connected to the first connector 42. With the above configuration, it can be ensured that the second connector 52 of the management unit plate 51 can be accurately and smoothly connected to the first connector 42 of the switching unit plate 41. Obviously, the guide groove 45 may also be arranged on a certain component in the housing 1, which is not limited here.

In this embodiment, the switching unit plate 41 is provided with a first adapter 411. An end of the adapter plate 43 adjacent to the switching unit plate 41 is provided with a second adapter 431 that can mate with the first adapter 411. The first connector 42 is arranged at an end of the adapter plate 43 away from the switching unit plate 41.

In this embodiment, the bottom plate 14 may be parallel to the switching unit plate 41. The adapter plate 43 may be arranged parallel to the first end plate 11; or the adapter plate 43 may also be arranged parallel to the first side plate 15, which is not limited here.

Figure 9:
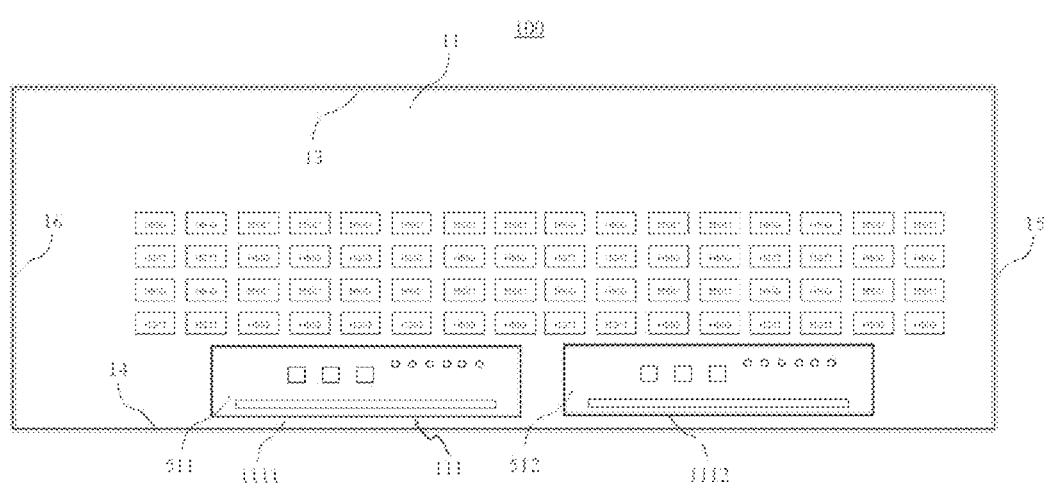
FIG. 9 shows a schematic structural diagram of a network switch along a side view according to some other embodiments of the present disclosure, where the management unit plate comprises the first management unit plate and the second management unit plate and is adjacent to the bottom plate.

FIG. 9 shows a schematic structural diagram of a network switch 100 along a side view according to some other embodiments of the present disclosure. The management unit plate 51 in FIG. 9 comprises a first management unit plate 511 and a second management unit plate 512, and the management unit plate 51 is adjacent to the bottom plate 14. As shown in FIG. 9, the moving slot 111 may further comprise a first moving slot 1111 and a second moving slot 1112, and the first moving slot 1111 and the second moving slot 1112 are spaced apart from each other. The first management unit plate 511 and the second management unit plate 512 are respectively adjacent to the bottom plate 14. The first management unit plate 511 and the second management unit plate 512 are spaced apart from each other in a direction from the first side plate 15 to the second side plate 16. It should be noted that the manner of connection between the management unit plate 51 and the switching unit plate 41 in FIG. 9 is the same as that between the management unit plate 51 and the switching unit plate 41 in FIGS. 7 and 8, and details are not described herein.

Figure 10:
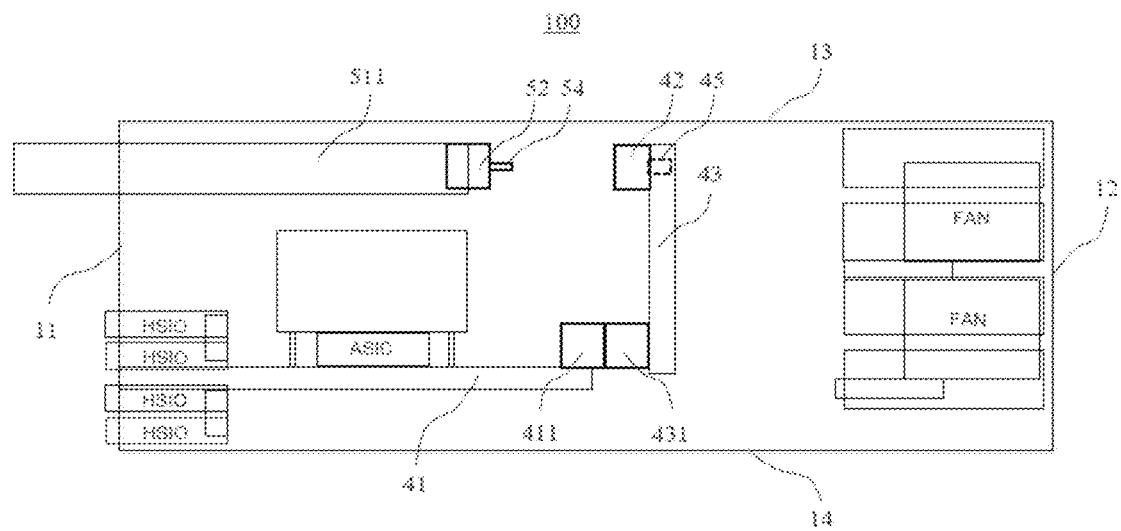
FIG. 10 shows a schematic structural diagram of a network switch along a front view according to some other embodiments of the present disclosure, where the management unit is away from the bottom plate.
Figure 11:
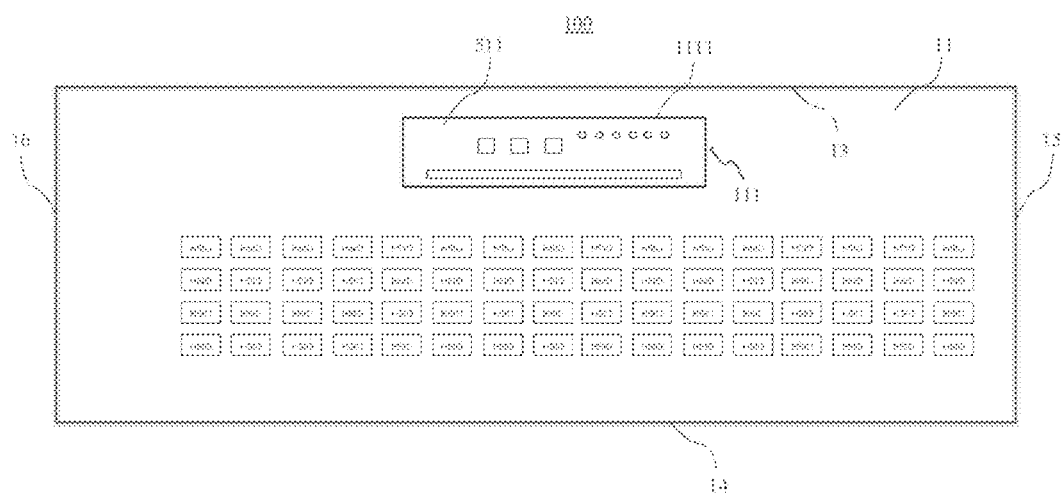
FIG. 11 shows a schematic structural diagram of the network switch shown in FIG. 10 along a side view.

FIG. 10 shows a schematic structural diagram of a network switch 100 along a front view according to some other embodiments of the present disclosure. The management unit 5 in FIG. 10 is away from the bottom plate 14. FIG. 11 shows a schematic structural diagram of the network switch 100 shown in FIG. 10 along a side view. As shown in FIGS. 10 and 11, in some other embodiments, the moving slot 111 may comprise a first moving slot 1111, and the management unit plate 51 may comprise a first management unit plate 511. The first management unit plate 511 is arranged in the first moving slot 1111, and the first management unit plate 511 is movable along the first moving slot 1111. The first management unit plate 511 is away from the bottom plate 14, then the switching unit plate 41 is adjacent to the bottom plate 14. The management unit 5 is staggered from the input/output port 44 to avoid interference of the input/output port 44 with the movement of the management unit 5. The switching unit 4 further comprises an adapter plate 43 connected to the switching unit plate 41, and the first connector 42 is arranged on the adapter plate 43, that is, the switching unit plate 41 and the management unit plate 51 are connected by the adapter plate 43.

Obviously, by pulling the first management unit plate 511 in a direction away from the second end plate 12, the first management unit plate 511 is drawn out of the housing 1 through the first end plate 11, and the second connector 52 is disconnected from the first connector 42. By pushing the first management unit plate 511 in a direction toward the second end plate 12, the first management unit plate 511 is inserted into the housing 1 through the first end plate 11, and the second connector 52 may be connected to the first connector 42.

In this embodiment, the second connector 52 may be located at an end of the first management unit plate 511 facing the second end plate 12. The guide member 54 may be arranged at an end of the first management unit plate 511 adjacent to the second end plate 12, and the guide member 54 may also be adjacent to the second connector 52. Correspondingly, with reference to FIG. 10, the adapter plate 43 is provided with a guide groove 45 mating with the guide member 54. When the guide member 54 mates with the guide groove 45, the second connector 52 may be connected to the first connector 42. With the above configuration, it can be ensured that the second connector 52 of the management unit plate 51 can be accurately and smoothly connected to the first connector 42 of the switching unit plate 41. Obviously, the guide groove 45 may also be arranged on a certain component in the housing 1, which is not limited here.

In this embodiment, the switching unit plate 41 is provided with a first adapter 411. An end of the adapter plate 43 adjacent to the switching unit plate 41 is provided with a second adapter 431 that can mate with the first adapter 411. The first connector 42 is arranged at an end of the adapter plate 43 away from the switching unit plate 41.

In this embodiment, the bottom plate 14 may be parallel to the switching unit plate 41. The adapter plate 43 may be arranged parallel to the first end plate 11; or the adapter plate 43 may also be arranged parallel to the first side plate 15, which is not limited here.

Figure 12:
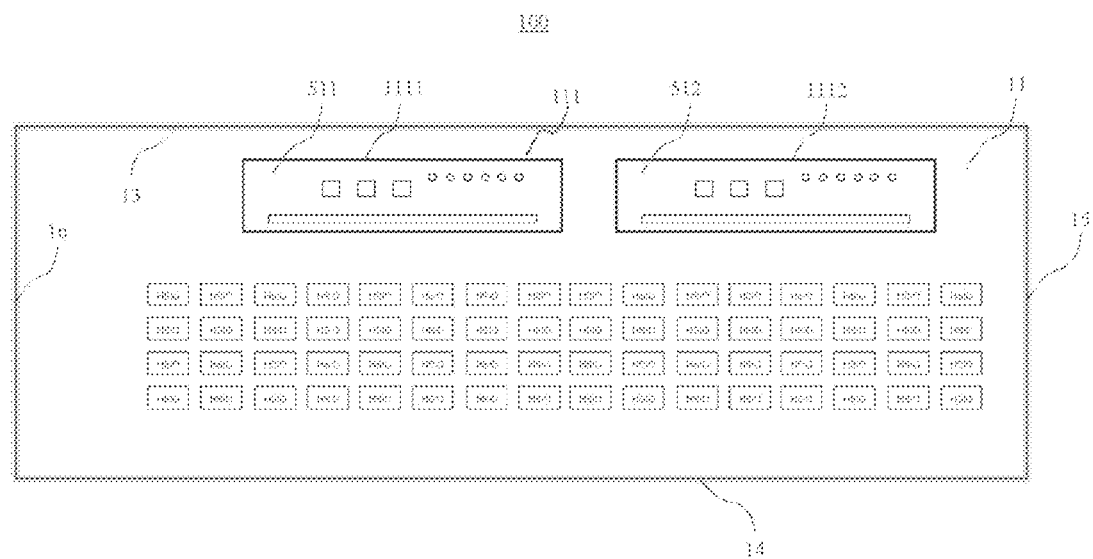
FIG. 12 shows a schematic structural diagram of a network switch along a side view according to some other embodiments of the present disclosure, where the management unit plate comprises the first management unit plate and the second management unit plate and is away from the bottom plate.

FIG. 12 shows a schematic structural diagram of a network switch 100 along a side view according to some other embodiments of the present disclosure. The management unit plate 51 in FIG. 12 comprises a first management unit plate 511 and a second management unit plate 512, and the management unit plate 51 is away from the bottom plate 14. As shown in FIG. 12, the moving slot 111 may further comprise a first moving slot 1111 and a second moving slot 1112, and the first moving slot 1111 and the second moving slot 1112 are spaced apart from each other. The management unit plate 51 may further comprise a first management unit plate 511 and a second management unit plate 512, and the first management unit plate 511 and the second management unit plate 512 are respectively away from the bottom plate 14. The first management unit plate 511 and the second management unit plate 512 are spaced apart from each other in a direction from the first side plate 15 to the second side plate 16. It should be noted that the manner of the connection between the management unit plate 51 and the switching unit plate 41 in FIG. 12 is the same as that between the management unit plate 51 and the switching unit plate 41 in FIGS. 10 and 11, and details are not described herein.

The design layout of the management unit 5 and the switching unit 4 according to the embodiments of the present disclosure may be applied to various network switches 100, so that when components on the management unit plate 51 fail, the entire device needs to be replaced, resulting in a cumbersome maintenance process and a high maintenance cost. It should be understood that the design layout of the management unit 5 and the switching unit 4 according to the embodiments of the present disclosure may also be applied to other components, which is not limited in the embodiments of the present disclosure.

Embodiments of the present disclosure are also reflected in the following examples.

Example 1. A network switch, comprising: a housing comprising a first end plate and a second end plate spaced apart from each other; a fan module and a power supply module respectively arranged in the housing adjacent to the second end plate; a switching unit arranged in the housing at least partially adjacent to the first end plate, the switching unit comprising a first connector arranged in the housing; and a management unit arranged in the housing and movable relative to the second end plate, and the switching unit is located outside a path of the management unit moving in a direction away from the second end plate, an end of the management unit adjacent to the second end plate is provided with a second connector capable of mating with the first connector, wherein when the management unit is drawn out of the housing through the first end plate in a direction away from the second end plate, the second connector is disconnected from the first connector; and when the management unit is inserted into the housing through the first end plate in a direction toward the second end plate, the second connector is connected to the first connector.

Example 2. The network switch according to Example 1, wherein a moving slot is provided on the first end plate, the management unit comprises a management unit plate provided with the second connector, and the management unit plate is arranged in the moving slot and is movable relative to the second end plate along the moving slot.

Example 3. The network switch according to Example 2, wherein the moving slot comprises a first moving slot and a second moving slot spaced apart from each other, the management unit plate comprises a first management unit plate arranged in the first moving slot and a second management unit plate arranged in the second moving slot, and the management unit plate and the second management unit plate are respectively provided with the second connector.

Example 4. The network switch according to Example 2, wherein the switching unit comprises a switching unit plate arranged in the housing adjacent to the first end plate, the housing further comprises a bottom plate and a first side plate and a second side plate spaced apart from each other, the bottom plate is parallel to the switching unit plate, and the first end plate, the second end plate, the bottom plate, the first side plate and the second side plate form the housing together.

Example 5. The network switch according to Example 4, wherein an end of the management unit plate adjacent to the second end plate is provided with a guide member, the switching unit plate is provided with a guide groove mating with the guide member, and when the guide member mates with the guide groove, the second connector is connected to the first connector.

Example 6. The network switch according to Example 4, wherein when the management unit plate is adjacent to or away from the first side plate, the first connector is arranged on the switching unit plate.

Example 7. The network switch according to Example 4, wherein when the management unit plate is adjacent to or away from the bottom plate, the switching unit plate is away from or adjacent to the bottom plate, the switching unit further comprises an adapter plate connected to the switching unit plate, and the first connector is arranged on the adapter plate.

Example 8. The network switch according to Example 7, wherein the switching unit plate is provided with a first adapter, an end of the adapter plate adjacent to the switching unit plate is provided with a second adapter mating with the first adapter, and the first connector is arranged at an end of the adapter plate away from the switching unit plate.

Example 9. The network switch according to Example 7, wherein the adapter plate is arranged parallel to the first end plate; or the adapter plate is arranged parallel to the first side plate.

Example 10. The network switch according to Example 2, wherein an end of the management unit plate away from the second end plate is provided with a management interface.

Example 11. The network switch according to Example 2, wherein the management unit further comprises a handle arranged away from the second end plate, the handle is switchable between a pressed position and a popped position, wherein the handle is retracted into the management unit when the handle is in the pressed position, and the handle extends out of the management unit and allows the management unit to be drawn out relative to the second end plate when the handle is in the popped position.

The foregoing has described the embodiments of the present disclosure. The above description is exemplary, not exhaustive, and is not limited to the disclosed embodiments. Many modifications and changes are obvious to those of ordinary skill in the art without departing from the scope and spirit of the described embodiments. The selection of terms used herein is intended to best explain the principles, practical applications or technical improvements to the market of the embodiments, or to make other ordinary skilled in the art understand the embodiments disclosed herein.

We claim:

1. A network switch, comprising:
a housing comprising a first end plate and a second end plate spaced apart from each other, and a bottom plate;
a fan module and a power supply module respectively disposed in the housing adjacent to the second end plate;
a switching unit at least partially disposed in the housing adjacent to the first end plate, the switching unit comprising a first connector disposed in the housing and a switching unit plate disposed in the housing adjacent to the first end plate, the switching unit plate being parallel to the bottom plate; and
a management unit disposed in the housing and movable relative to the second end plate, the switching unit being located outside a path of the management unit moving in a direction away from the second end plate, an end of the management unit adjacent to the second end plate being provided with a second connector capable of mating with the first connector, the management unit comprising a management unit plate provided with the second connector, wherein the second connector is disconnected from the first connector when the management unit is drawn out of the housing through the first end plate in a direction away from the second end plate; and the second connector is connected to the first connector when the management unit is inserted into the housing through the first end plate in a direction toward the second end plate, and wherein the management unit plate is parallel to the switching unit plate, when the management unit plate is adjacent to the bottom plate, the switching unit plate is away from the bottom plate, when the management unit plate is away from the bottom plate, the switching unit plate is adjacent to the bottom plate, the switching unit further comprises an adapter plate connected to the switching unit plate, and the first connector is disposed on the adapter plate.

2. The network switch according to claim 1, wherein a moving slot is provided on the first end plate, and the management unit plate is disposed in the moving slot and is movable relative to the second end plate along the moving slot.

3. The network switch according to claim 2, wherein the moving slot comprises a first moving slot and a second moving slot spaced apart from each other, the management unit plate comprises a first management unit plate disposed in the first moving slot and a second management unit plate disposed in the second moving slot, and the management unit plate and the second management unit plate are respectively provided with the second connector.

4. The network switch according to claim 2, wherein the housing further comprises a first side plate and a second side plate spaced apart from each other, and the first end plate, the second end plate, the bottom plate, the first side plate and the second side plate together form the housing.

5. The network switch according to claim 4, wherein an end of the management unit plate adjacent to the second end plate is provided with a guide member, the switching unit plate is provided with a guide groove mating with the guide member, and when the guide member mates with the guide groove, the second connector is connected to the first connector.

6. The network switch according to claim 4, wherein the first connector is disposed on the switching unit plate when the management unit plate is adjacent to or away from the first side plate.

7. The network switch according to claim 4, wherein the switching unit plate is provided with a first adapter, an end of the adapter plate adjacent to the switching unit plate is provided with a second adapter mating with the first adapter, and an end of the adapter plate away from the switching unit plate is provided with the first connector.

8. The network switch according to claim 4, wherein the adapter plate is arranged in parallel to the first end plate; or the adapter plate is arranged in parallel to the first side plate.

9. The network switch according to claim 2, wherein an end of the management unit plate away from the second end plate is provided with a management interface.

10. The network switch according to claim 2, wherein the management unit further comprises a handle arranged away from the second end plate, and the handle is switchable between a pressed position and a popped position, wherein the handle is retracted into the management unit when the handle is in the pressed position, and the handle extends out of the management unit and allows the management unit to be drawn out relative to the second end plate when the handle is in the popped position.

* * * * *